United States Patent
Yu (10) Patent No.: US 6,549,439 B1
(45) Date of Patent: *Apr. 15, 2003

(54) FULL WAVE RECTIFIER CIRCUIT USING NORMALLY OFF JFETS

(75) Inventor: Ho-Yuan Yu, Saratoga, CA (US)

(73) Assignee: Lovoltech, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/915,987

(22) Filed: Jul. 25, 2001

Related U.S. Application Data (63) Continuation of application No. 09/741,488, filed on Dec. 18, 2000.
(60) Provisional application No. 60/167,959, filed on Nov. 29, 1999.

(51) Int. Cl.[7] .............................................. H02M 7/217
(52) U.S. Cl. ...................................................... 363/127
(58) Field of Search ......................................... 363/127

(56) References Cited

U.S. PATENT DOCUMENTS

| | | | |
|---|---|---|---|
| 4,139,880 A | * 2/1979 | Ulmer et al. | 363/127 |
| 4,319,144 A | * 3/1982 | King et al. | 363/127 |
| 4,423,456 A | * 12/1983 | Zaidenweber | 363/127 |
| 4,473,757 A | * 9/1984 | Farago et al. | 363/127 |
| 4,535,203 A | * 8/1985 | Jenkins et al. | 363/127 |
| 5,870,031 A | * 2/1999 | Kaiser et al. | 363/127 |
| 6,078,512 A | * 6/2000 | Bouvier | 363/127 |
| 6,349,047 B1 | * 2/2002 | Yu | 363/127 |

* cited by examiner

Primary Examiner—Jeffrey Sterrett
(74) Attorney, Agent, or Firm—Wagner, Murabito, Hao LLP (57) ABSTRACT

A four terminal full wave rectifier circuit that can be used as a pin for pin replacement for the full wave diode rectifier circuit commonly used in DC power supply circuits. Two full wave rectifier circuits that can efficiently supply the DC currents required in both discrete and integrated circuits being operated at low DC supply voltages are disclosed. Both circuits utilize two n-channel, enhancement mode Junction Field Effect Transistors (JFET) and two p-channel, enhancement mode Junction Field Effect Transistors to replace the rectifier diodes used in a conventional full wave rectifier circuit. The forward voltage drop across each JFET is considerably smaller than the forward voltage drop of a conventional rectifier. In a first configuration, the JFETs are all symmetrical about the source and drain leads. Starter devices are connected between source and drain leads and current limiting devices are in series with the gate leads. The gate leads of the JFETs are connected to the input terminals of the circuit such that a full wave rectified version of the input signal is produced at the output of the circuit. In a second configuration, two asymmetrical n-channel and two asymmetrical p-channel JFETs are used to replace the four rectifier diodes found in a conventional full wave rectifier circuit. The gate of each JFET is connected to its source lead and a full wave rectified version of the input signal is then produced at the output of this circuit.

22 Claims, 10 Drawing Sheets

FULL WAVE RECTIFIER CIRCUIT USING NORMALLY OFF JFETS

RELATED APPLICATIONS

The following U.S. patent application Ser. No. 09/430,500, "NOVEL JFET STRUCTURE AND MANUFACTURE METHOD FOR LOW ON RESISTANCE AND LOW VOLTAGE APPLICATIONS," Ho-Yuan Yu, filed Oct. 29, 1999, and issued as U.S. Pat. No. 6,251,716 B1 on Jun. 26, 2001, is incorporated herein by reference for all purposes. This application is a continuation of U.S. patent application Ser. No. 09/741,488 filed Dec. 18, 2000. The following U.S. provisional patent application Serial No. 60/167,959, "STARTER DEVICE FOR NORMALLY OFF JFETS," Ho-Yuan Yu, filed Nov. 29, 1999, and associated utility application, entitled "STARTER DEVICE FOR NORMALLY OFF JFETS," filed Nov. 7, 2000, Ser. No. 09/708,336, by Ho-Yuan Yu, are incorporated herein by reference for all purposes.

BACKGROUND OF THE INVENTION

1. Field of the Invention

The present invention relates generally to the field of low voltage, high current DC rectifier circuits. More particularly, the present invention relates to utilization of both symmetrical and asymmetrical, normally off Junction Field Effect Transistors (JFET) to construct full wave rectifier circuits useful in low voltage and high current density DC applications.

2. Related Art

The increasing trend toward lower supply voltages for active semiconductor devices and Integrated Circuits (IC's) has accelerated the search for more efficient low voltage power sources. Conventional power supplies utilizing full wave rectifier circuits constructed with silicon diode rectifiers are unacceptable in low voltage applications due to the excessive voltage drop across the forward biased diode terminals. Power loss in the diodes becomes excessive when they are used as rectifiers in a DC power supply designed for a terminal voltage as low as 3.0 volts.

Semiconductor diodes are combined with active devices to form circuits capable of producing low value DC supply voltages, but such circuits are generally not capable of handling the large currents frequently required. They usually exhibit a fairly large internal resistance and as such are very inefficient power sources. Furthermore, the number and complexity of steps required in the processing of this type of circuit as an IC also increases with the number of devices included.

Active semiconductor devices are used as switches in circuit arrangements producing DC power supply voltages, as for example in switched mode power supplies. Junction Field Effect Transistors (JFET) are frequently used as switches because they are easily switched between an ON or conducting state and an OFF or non-conducting state. Most importantly, the current carriers in a JFET are all majority carriers which results in short switching times. However, when operated at lower voltages, JFETs exhibit an internal resistance in the ON state that make them unsatisfactory and inefficient in applications requiring large currents.

SUMMARY OF THE INVENTION

Utilizing two copending applications, Ser. No. 09/430,500 and serial No. 60/167,959 and Ser. No. 09/708,336, all by Ho-Yuan Yu, and incorporated herein by reference, embodiments of the efficient full wave rectifiers of the present invention can be made.

Accordingly, what is needed is a semiconductor circuit that can efficiently supply the DC currents required in both discrete and integrated circuits being operated at low DC supply voltages. What is further needed is a full wave, low voltage, power rectifier circuit manufactured as an integrated circuit that is a pin for pin replacement for the full wave rectifiers used in conventional DC power supply circuits. What is also needed is a full wave rectifier circuit that has a very low internal resistance such that the power dissipated in the rectifier circuit itself is only a fraction of that delivered to a connected load. What is needed yet is a full wave rectifier circuit that exhibits short switching times between an on or conducting state and an off or non-conducting state. The present invention provides these advantages and others not specifically mentioned above but described in the sections to follow.

A full wave rectifier circuit that can efficiently supply the DC currents required in both discrete and integrated circuits being operated at low DC supply voltages is disclosed. In the present invention, four symmetrical, enhancement mode, Junction Field Effect Transistors (JFET) are connected to form a full wave rectifier circuit having two input terminals and two output terminals. In one embodiment, each JFET may have a starter device connected between source and drain, and a current limiting circuit in series with the gate lead. With an external voltage applied between the gate and either the source or the drain with a polarity that will forward bias the p-n junctions, low resistance, current conducting channels are formed between source and drain. This is the on or current conducting state for each JFET. Due to the biasing of the gate voltage, the voltage drop between source and drain of the normally off JFET in the on state is less than 0.1 volt, depending on device design.

With an external voltage applied between the gate and either the source or the drain with a polarity that will reverse bias the p-n junctions, the built-in p-n junction depletion regions will isolate the source and drain leads to prevent the conduction of electric current between source and drain. This is the off or non conducting state or each JFET. Thus, each JFET has a forward or current conducting state and a reverse or non current conducting state similar to a conventional semiconductor diode. Two n-channel and two p-channel JFETs are used to replace of the four semiconductor diodes found in a conventional full wave rectifier circuit. The gate leads of the JFETs are connected to the input terminals of the circuit such that a full wave rectified version of the input signal is produced at the output of the circuit.

In a second embodiment, four asymmetrical, enhancement mode, Junction Field Effect Transistors (JFET) are connected to form a full wave rectifier circuit having two input terminals and two output terminals. The gate of each JFET is electrically connected to its source. With an external voltage applied between source and drain with a polarity that will forward bias the p-n junctions between gate and drain, low resistance, current conducting channels are formed between source and drain. This is the on or current conducting state. The forward voltage drop of this embodiment is approximately the threshold voltage of the normally off JFET.

With an external voltage applied between source and drain with a polarity that will reverse bias the p-n junctions between gate and drain, the built-in p-n junction depletion regions will isolate the source and drain leads to prevent the conduction of electric current between source and drain. This is the off or non conducting state. Thus, each JFET has a forward or current conducting state and a reverse or non current conducting state similar to a conventional semiconductor diode. Two n-channel and two p-channel JFETs are used to replace of the four semiconductor diodes found in a conventional full wave rectifier circuit. A full wave rectified version of the input signal is produced at the output of this circuit.

DETAILED DESCRIPTION OF THE INVENTION

In the following detailed description of the present invention, full wave rectifier circuit using normally off JFETs, numerous specific details are set forth in order to provide a through understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
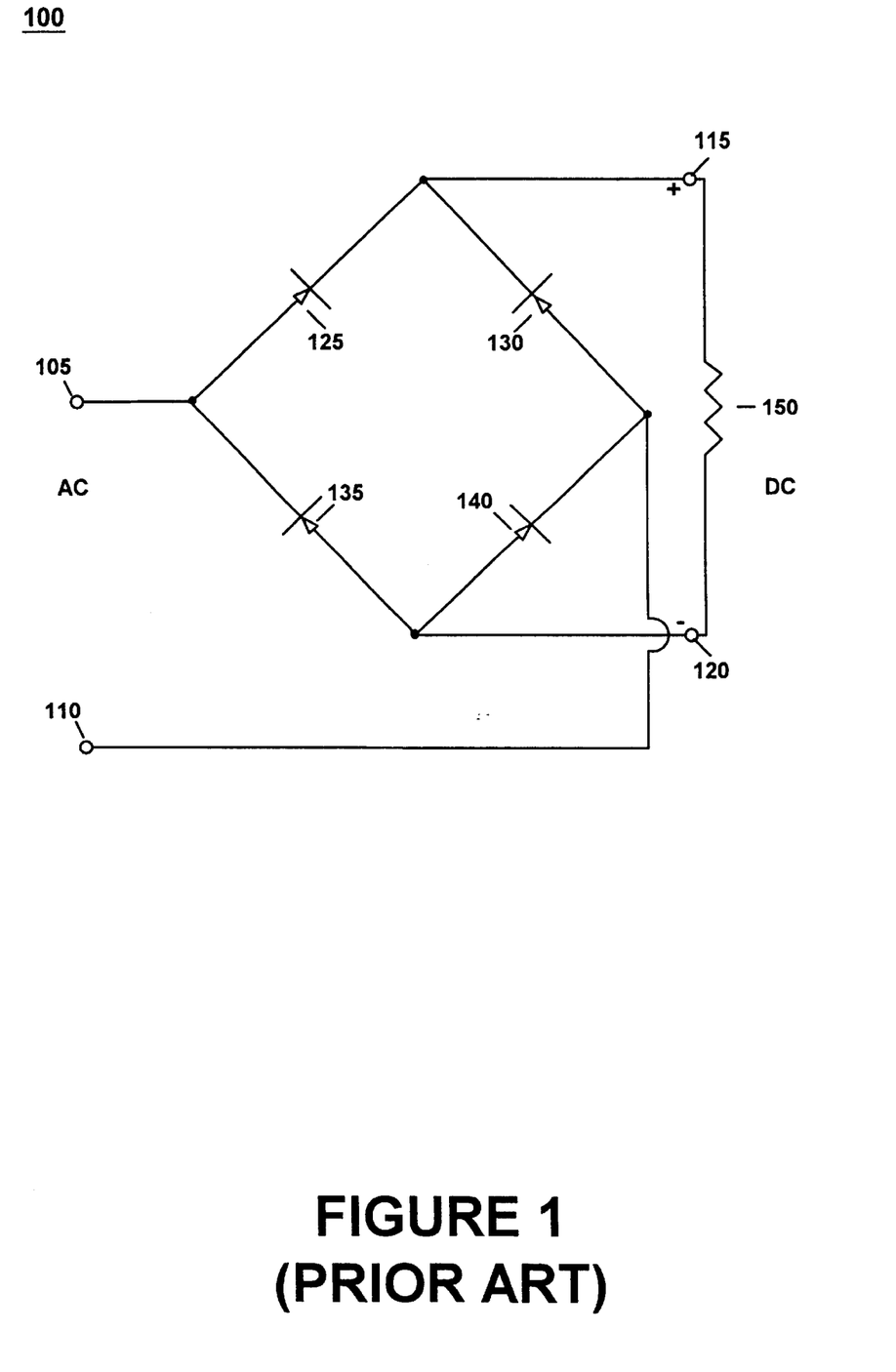
FIG. 1 is a schematic diagram of a conventional full wave rectifier circuit consisting of four rectifying diodes and an exemplary resistive load connected between the two output terminals.

FIG. 1 is the electrical schematic diagram of a conventional full wave rectifier circuit 100. The terminal 105 and the terminal 110 are the two input terminals, and the positive terminal 115 and the negative terminal 120 are the two output terminals. The resistor 150 is an exemplary load connected between the two output terminals. Full wave rectification is accomplished by the interconnection of four rectifying diodes 125, 130, 135 and 140. An electric current with positive voltage entering the positive input terminal will follow a path through diode 125, out the positive output terminal, through the resistive load, reenter the negative output terminal, through diode 140 and out the input terminal 110. An electric current entering the negative input terminal will follow a path through diode 130, out the positive output terminal, through the resistive load, reenter the negative output terminal, through diode 135 and out the input terminal 105.

Thus, an electric current in either of two possible directions in the input terminals will always result in a current in the same direction in the output terminals. An electric current that always has the same direction is defined as a direct current, even if it varies in amplitude. This circuit is then capable of converting a sinusoidal alternating current applied at the input terminals into a direct current at the output terminals. Such a circuit is commonly called a full wave rectifier.

Figure 2:
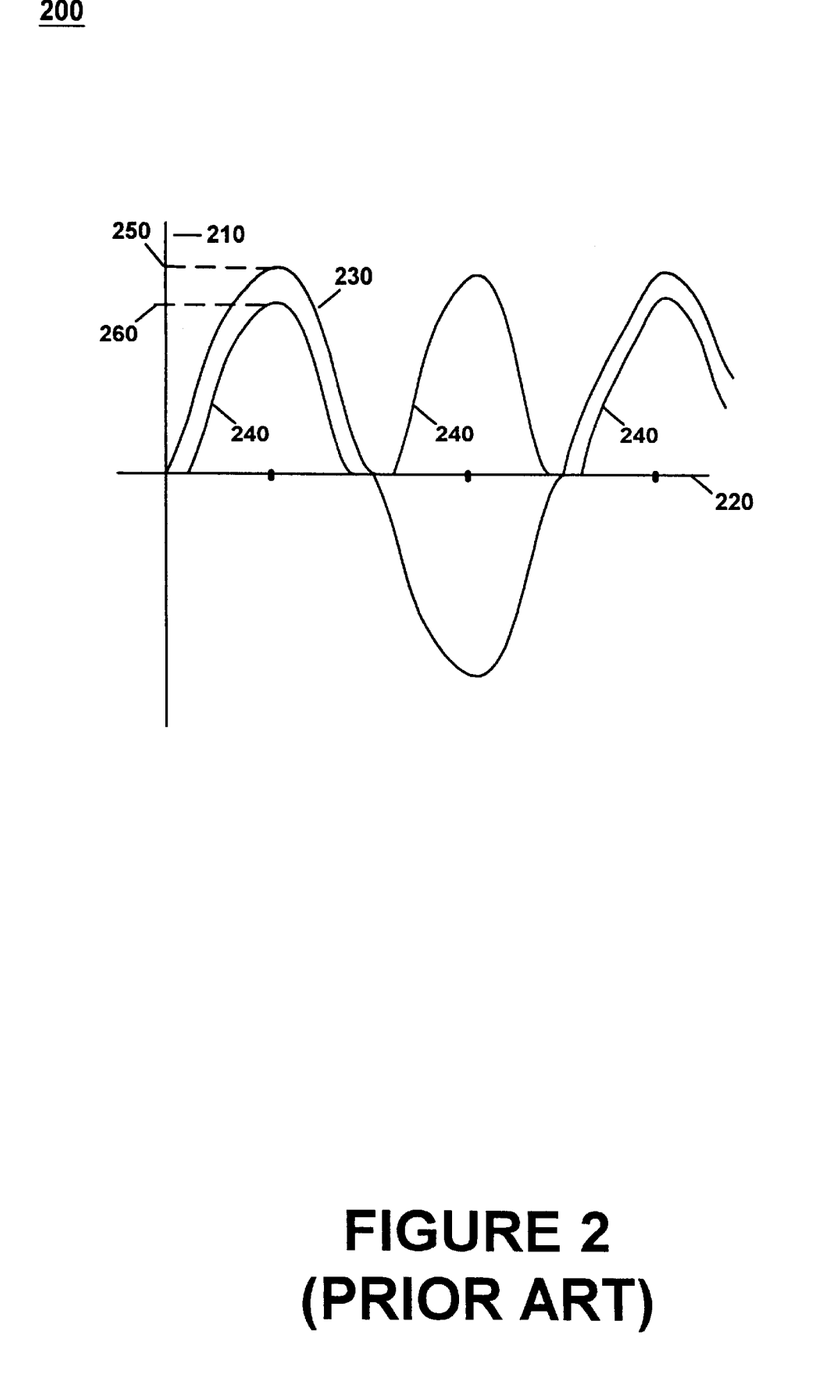
FIG. 2 are exemplary electrical waveforms for a full wave rectifier circuit showing a sinusoidal signal applied at the input and the full wave rectified signal present at the output.

FIG. 2 shows typical electrical waveforms 200 for a full wave rectifier circuit having a sinusoidal signal 230 applied at the input and the resulting full wave rectified signal 240 present at the output. The vertical axis 210 is either a voltage or a current scale while the horizontal axis 220 is a time scale. The peak value of the applied input signal 250 is always greater than the peak value of the rectified output waveform 260. The difference between these two peak values is representative of the power loss in the rectifier elements used in the circuit. The greater the difference, the greater the power loss and the greater the heating of the rectifier elements. In the case of semiconductor power diodes, this difference can be on the order of two volts, considering a voltage drop of about one volt for each diode. Clearly the power loss in full wave rectifier circuits using semiconductor diodes makes them a poor choice for dc power supply circuits to be used in low voltage applications. In the present invention, enhancement mode JFETs are used in place of semiconductor diodes to construct full wave rectifier circuits that overcome this excessive power loss.

Figure 3:
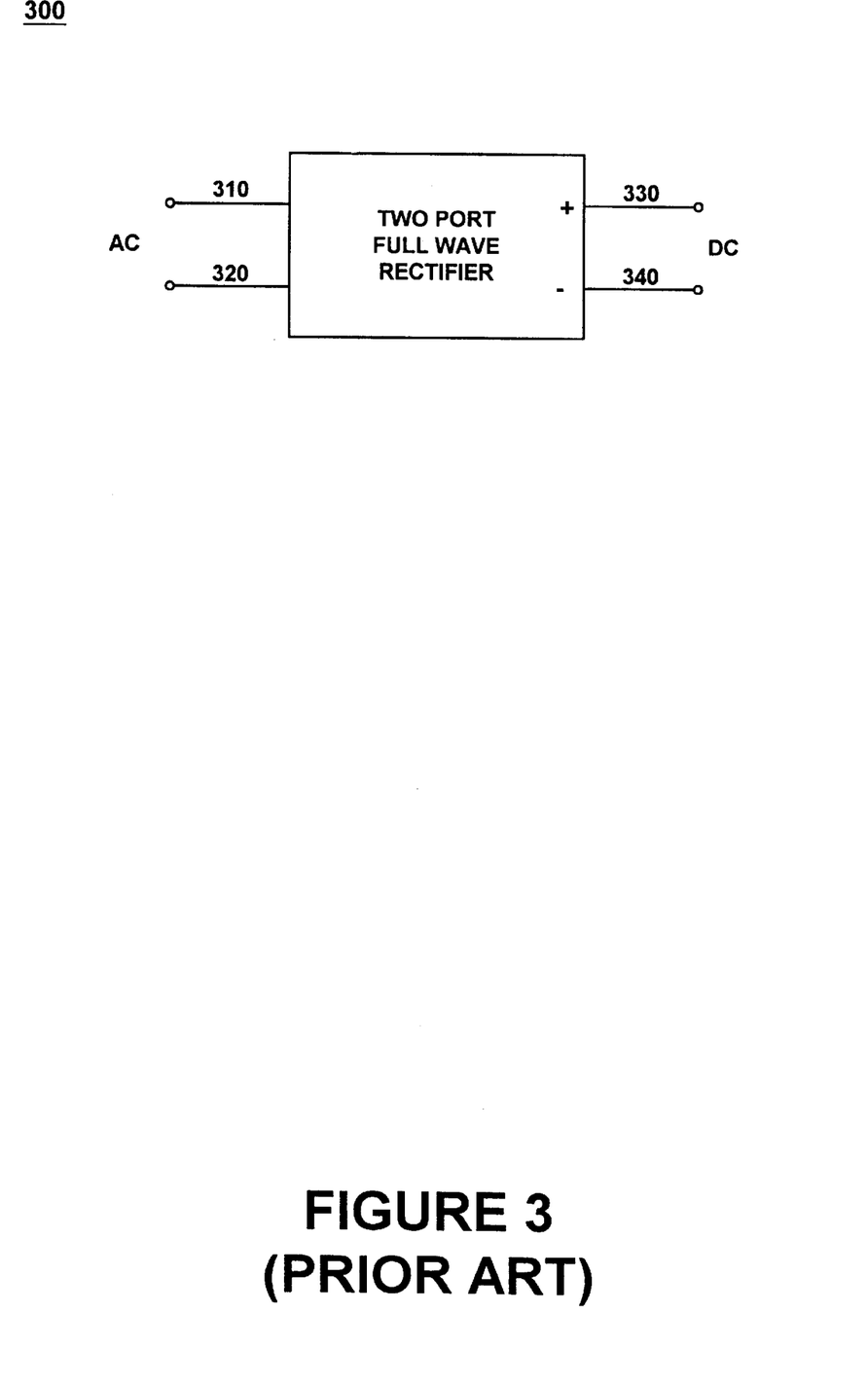
FIG. 3 is an exemplary cross sectional view showing the physical construction of a four terminal full wave rectifier circuit according to the present invention.

FIG. 3 shows the physical arrangement of a two-port network 300 for a full wave rectifier circuit. The positive input lead 310 and the negative input lead 320 form the two input terminals for the rectifier circuit. A source of electrical power generally in the form of a sinusoidal voltage is applied to the two input terminals. The positive output lead 330 and the negative output lead 340 are the two output leads for the rectifier circuit. An electrical load requiring power in the form of direct current is connected between the two output terminals.

Figure 4A:
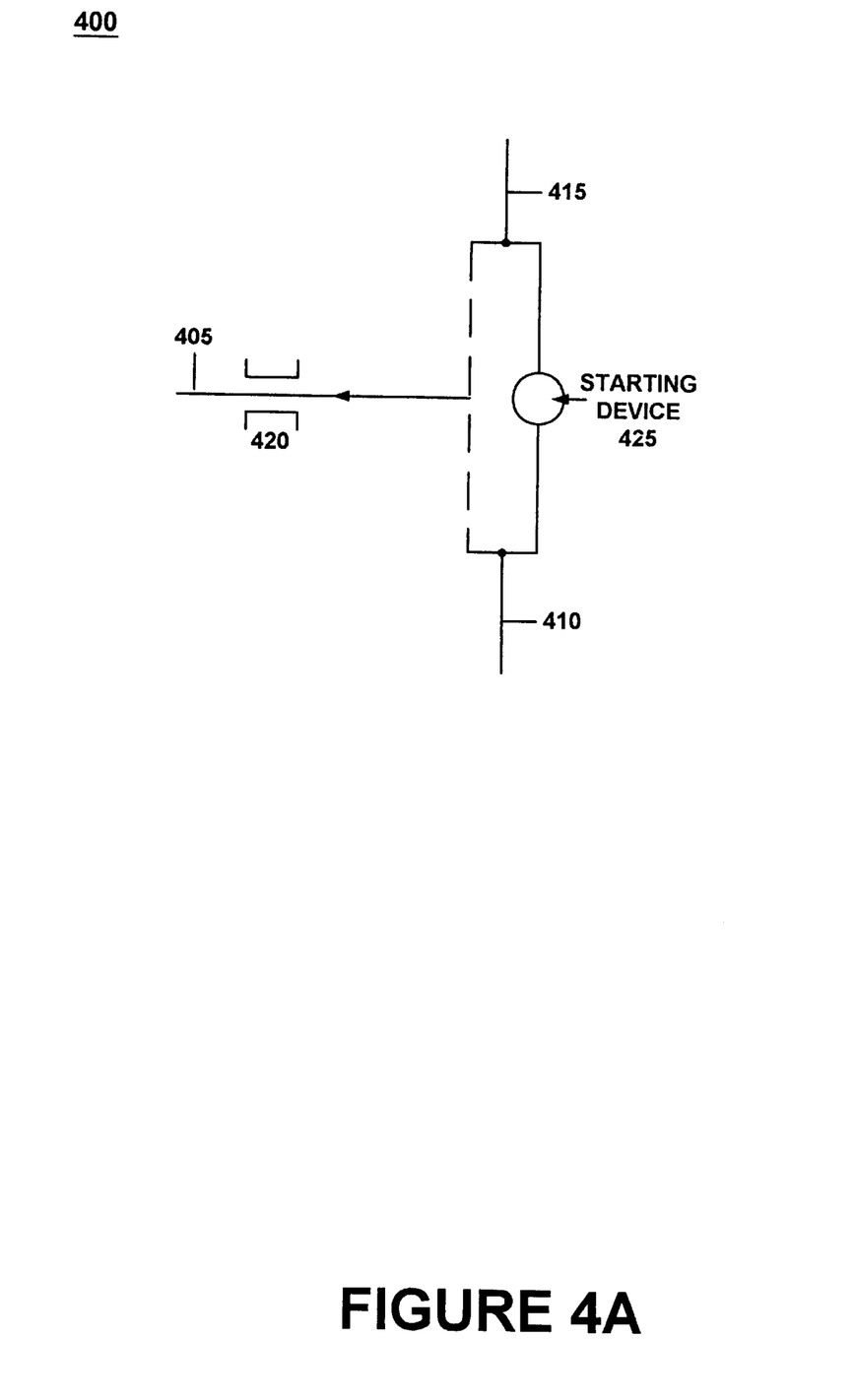
FIG. 4a is the electrical symbol for a symmetrical, p-channel, enhancement mode junction field effect transistor (JFET) having a starter device connected between the source and drain leads and a current limiting device connected in series with the gate lead according to an embodiment of the present invention.
Figure 4B:
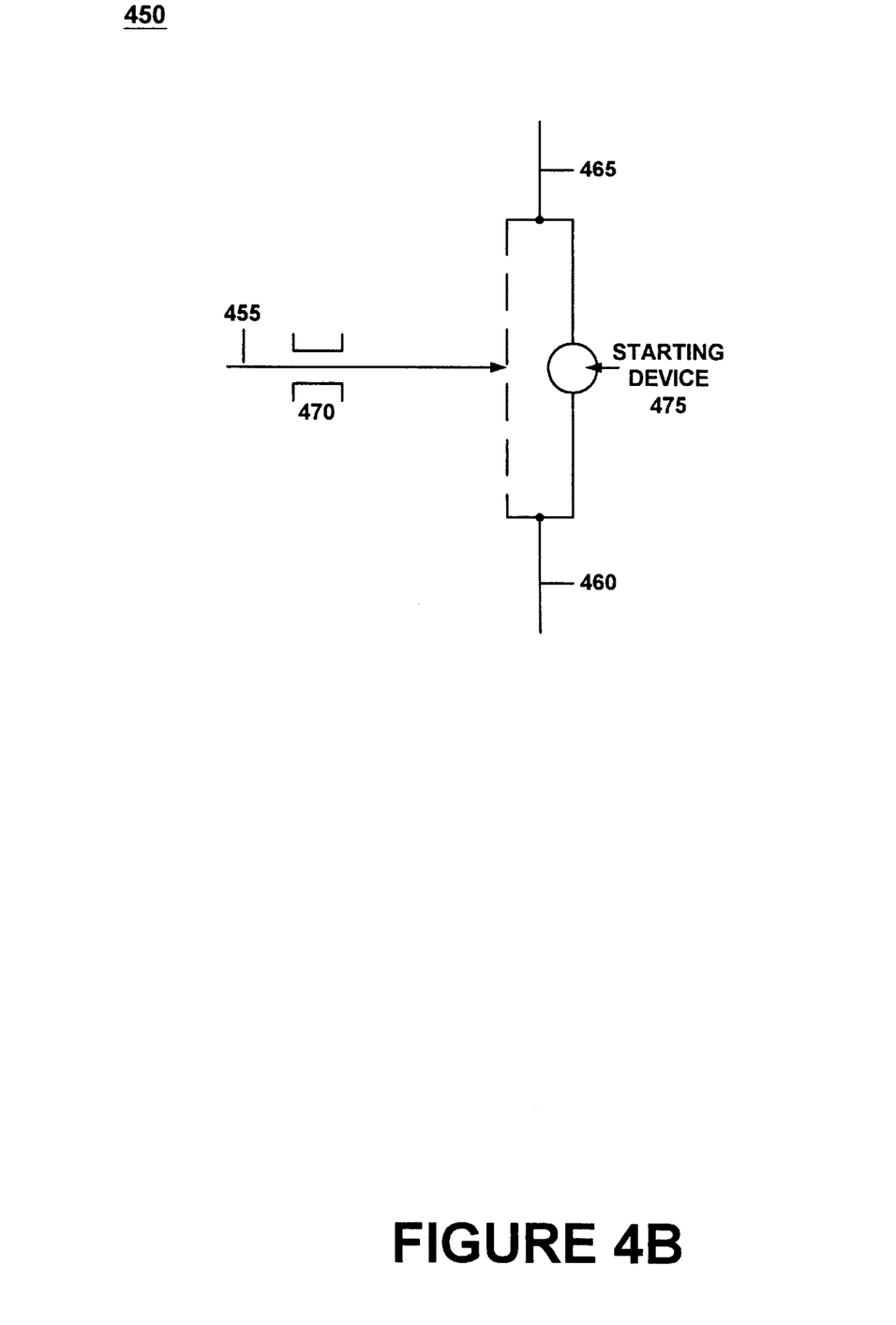
FIG. 4b is the electrical symbol for a symmetrical, n-channel, enhancement mode junction field effect transistor (JFET) having a starter device connected between the source and drain leads and a current limiting device connected in series with the gate lead according to an embodiment of the present invention.

FIG. 4a and FIG. 4b illustrate the symbols for n-channel and p-channel, enhancement mode JFETs used as rectifier elements in the present invention and described in cited copending application. A p-channel, enhancement mode JFET 400 is shown in FIG. 4a, having a gate lead 405, a source lead 410 and a drain lead 415. Since this device is symmetrical about the gate, the drain and source leads are interchangeable. A current limiting device 420 is connected in series with the gate lead to prevent excessive current flow. A starting device 425 is connected between the source and drain leads to enhance turn on characteristics. An applied potential difference causing the gate to be more negative than either the source or the drain will cause this device to conduct current between the source and drain leads. This is the on or conducting state. An applied potential difference causing the gate to be more positive than either the source or the drain will prevent current conduction between source and drain. This is the off or non conducting state. Thus this device behaves as a rectifying element. In the on or conducting state, the voltage drop between source and drain is generally less then one tenth of a volt when the gate voltage is above the threshold voltage that is dependent on doping levels and physical dimensions of the JFET.

An n-channel, enhancement mode JFET 450 is shown in FIG. 4b, having a gate lead 455, a source lead 460 and a drain lead 465. Since this device is symmetrical about the gate, the drain and source leads are interchangeable. A current limiting device 470 is connected in series with the gate lead to prevent excessive current flow. A starting device 475 is connected between the source and drain leads to enhance turn on characteristics. An applied potential difference causing the gate to be more positive than either the source or the drain will cause this device to conduct current between the source and drain leads. This is the on or conducting state. An applied potential difference causing the gate to be more negative than either the source or the drain will prevent current conduction between source and drain. This is the off or non conducting state. Thus this device behaves as a rectifying element.

Figure 5:
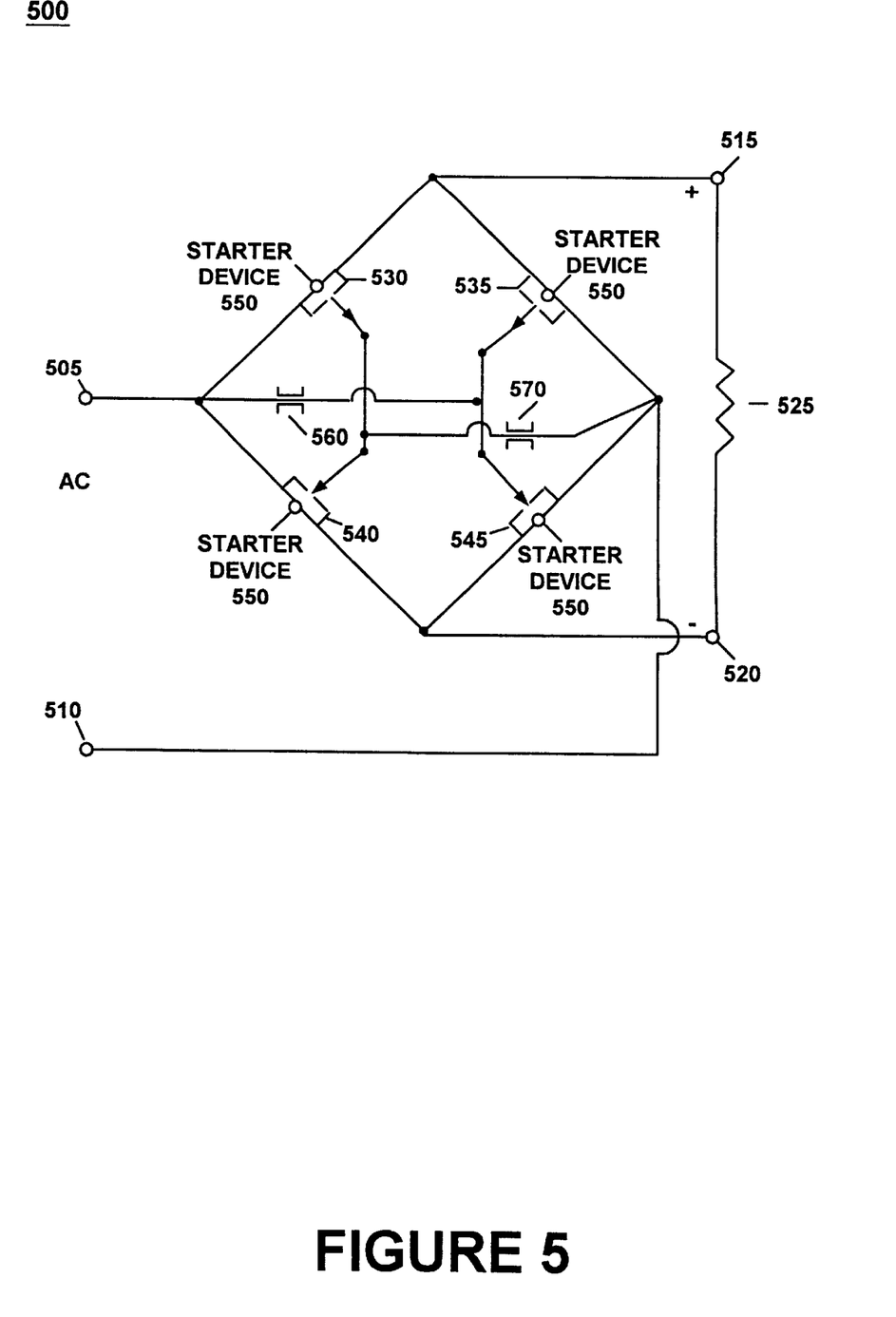
FIG. 5 is a schematic diagram of a full wave rectifier circuit consisting of two symmetrical, p-channel, enhancement mode JFETs, two symmetrical, n-channel, enhancement mode JFETs, four starter devices, two current limiting devices and an exemplary resistive load connected between the two output terminals according to an embodiment of the present invention.

FIG. 5 shows a full wave rectifier circuit 500 in which conventional semiconductor diodes have been replaced with symmetrical, or asymmetrical, enhancement mode JFETs as illustrated in FIG. 4a and FIG. 4b. The two input terminals are referenced as positive 505 and negative 510. The two output terminals are also referenced as positive 515 and negative 520. An exemplary resistive load 525 is connected between the two output terminals. There are two p-channel JFETs, 530 and 535, and two n-channel JFETs, 540 and 545. Each JFET has a starter device 550 connected between source and drain. A single current limiting device 560 is connected in series between the input terminal 505 and the gate leads of JFETs 535 and 545. A single current limiting device 570 is connected in series between the input terminal 510 and the gate leads of JFETs 530 and 540.

A positive voltage applied at the input terminal 501, with respect to the input reference polarities, will cause JFETs 530 and 545 to switch on, and JFETs 535 and 540 to switch off. A current path is thus opened from the input terminal 505, through JFET 530, out the output terminal 515, through the resistive load, into the output terminal 520, through JFET 545 and out the input terminal 510.

A negative voltage applied at the input terminal 505, with respect to the input reference polarities, will cause JFETs 535 and 540 to switch on, and JFETs 530 and 545 to switch off. A current path is thus opened from the input terminal 510, through JFET 535, out the output terminal 515, through the resistive load, into the negative output terminal 520, through JFET 540 and out the input terminal 505. Thus for either input voltage polarity, a direct current is produced at the output in a direction from the positive output terminal toward the negative output terminal. Due to active biasing the gates of normally off JFETs from the input terminal voltage, a very low voltage drop between the source and drain is achieved. The small voltage drop between source and drain in the on state means that the difference between peak input voltage and peak output voltage is less then one tenth of a volt at most. The power dissipated in the JFETs is thus minimized and this rectifier circuit is useful in low voltage power supply applications.

Figure 6A:
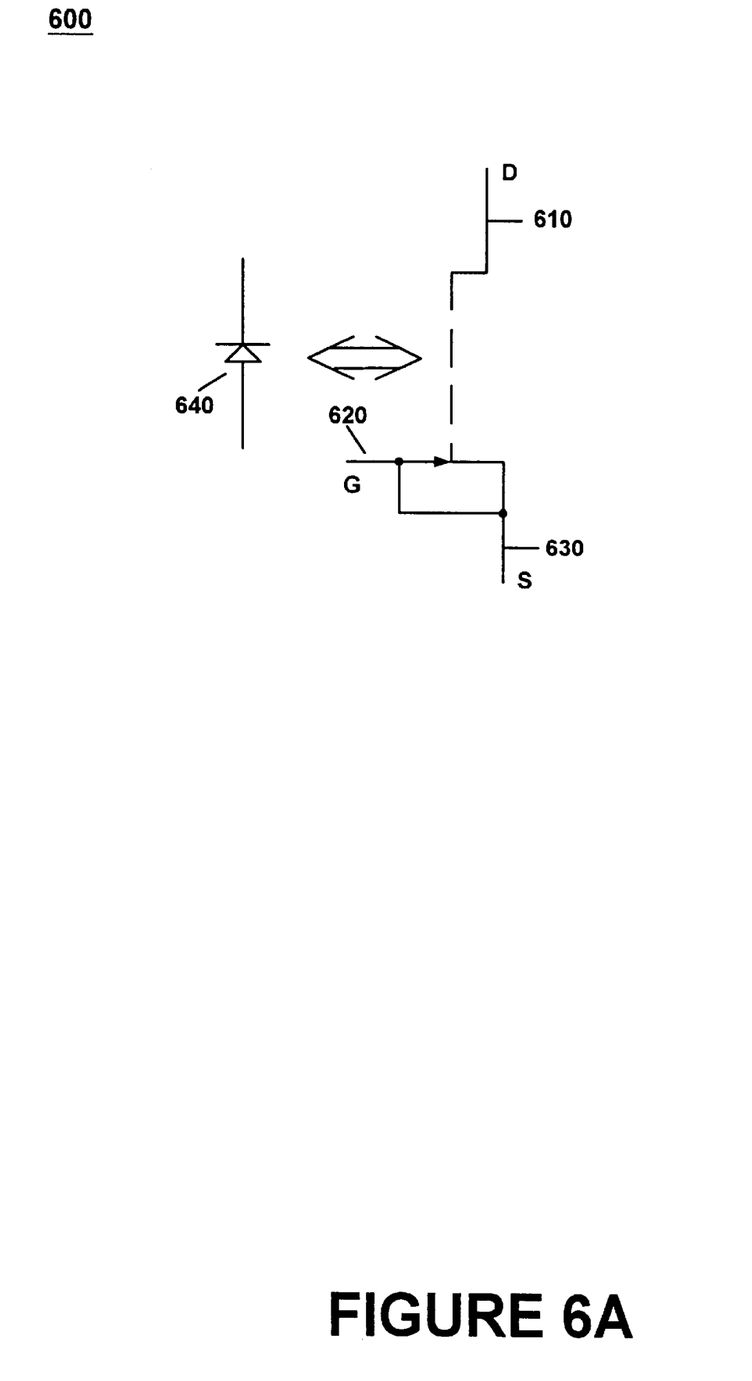
FIG. 6a is the electrical symbol for an asymmetrical, n-channel, enhancement mode JFET with the gate lead electrically connected to the source lead, and the diode electrical equivalent circuit shows how this device behaves as a rectifier lead according to an embodiment of the present invention.
Figure 6B:
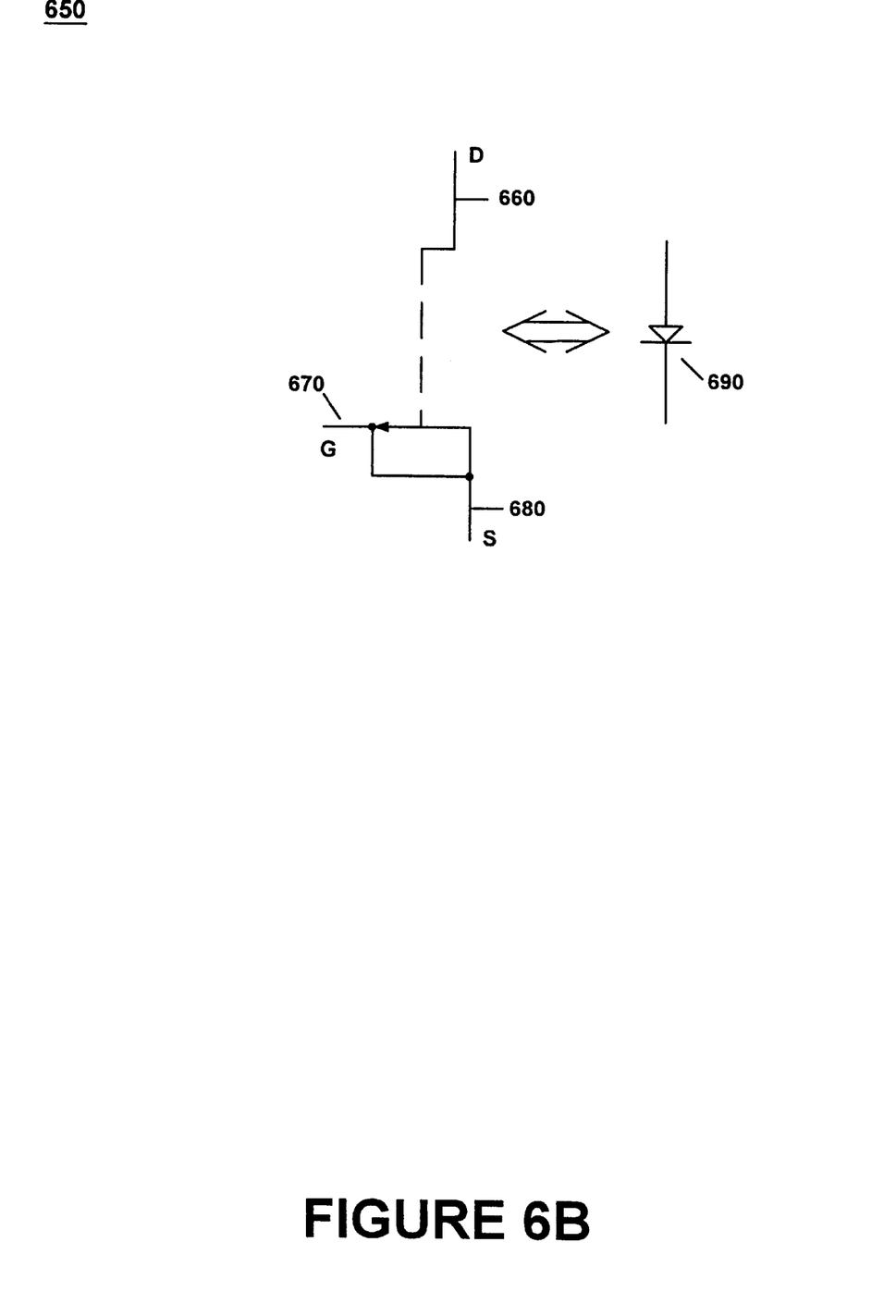
FIG. 6b is the electrical symbol for an asymmetrical, p-channel, enhancement mode JFET with the gate lead electrically connected to the source lead, and the diode electrical equivalent circuit shows how this device behaves as a rectifier lead according to an embodiment of the present invention.

FIG. 6a shows the symbol for an asymmetrical, enhancement mode n-channel JFET 600, with the gate lead 620 electrically connected to the source lead 630, and a drain lead 610. The diode electrical equivalent circuit 640 shows how this device behaves as a rectifier. FIG. 6b is the symbol for an asymmetrical, enhancement mode p-channel JFET 650 with the gate lead 670 electrically connected to the source lead 680, and a drain lead 660. The diode electrical equivalent circuit 690 shows how this device behaves as a rectifier. The forward voltage drop of this arrangement is reduced from almost one volt to close to the threshold voltage of the device.

Figure 7:
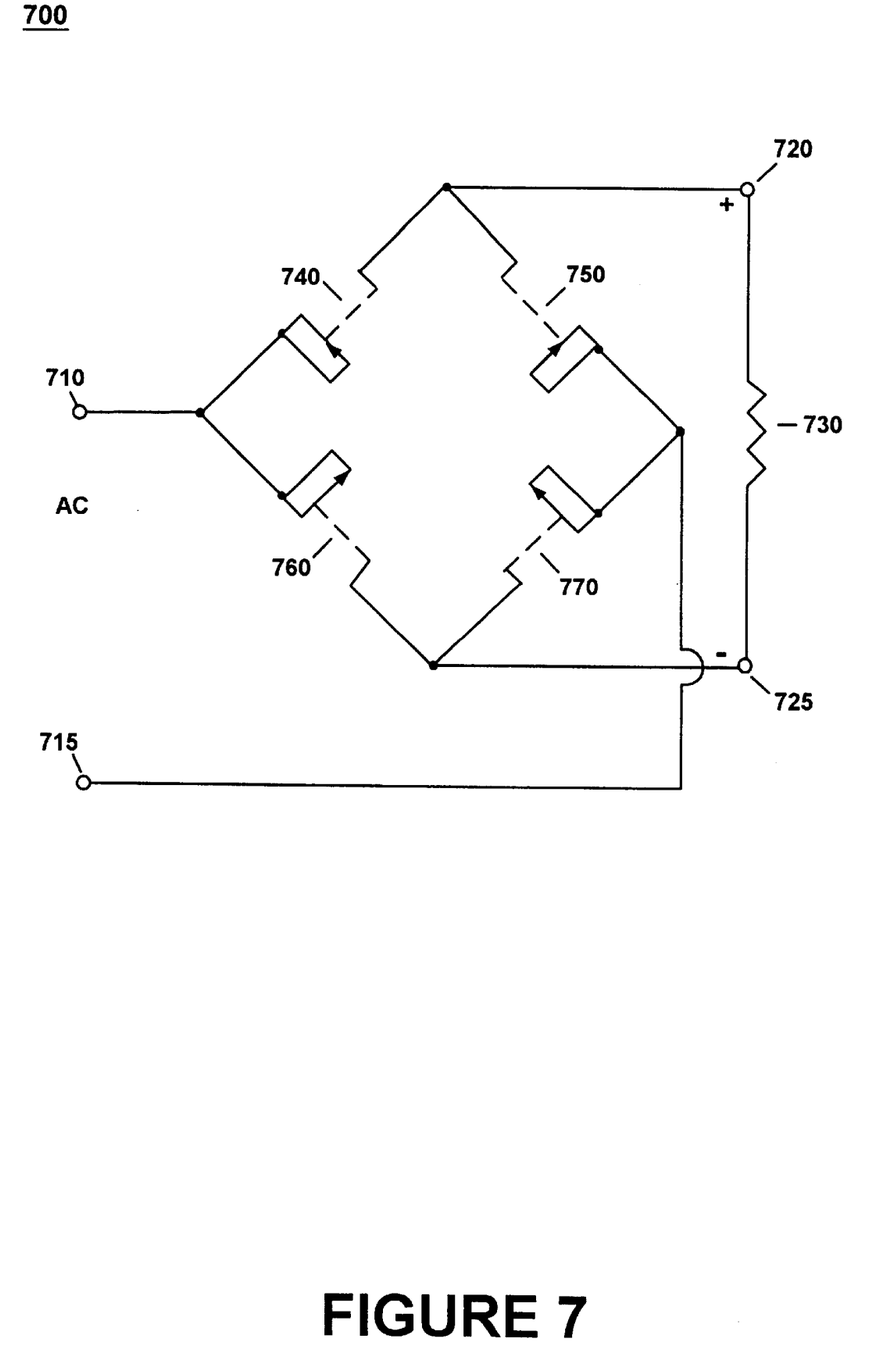
FIG. 7 is a schematic diagram of a full wave rectifier circuit consisting of two asymmetrical, p-channel, enhancement mode JFETs, two asymmetrical, n-channel, enhancement mode JFETs and an exemplary resistive load connected between the two output terminals according to an embodiment of the present invention.

FIG. 7 shows a full wave rectifier circuit 700 in which conventional semiconductor diodes have been replaced with asymmetrical, enhancement mode JFETs as illustrated in FIG. 6. The two input terminals are referenced as positive 710 and negative 715. The two output terminals are also referenced as positive 720 and negative 725. An exemplary resistive load 730 is connected between the two output terminals. There are two p-channel JFETs, 760 and 770, and two p-channel JFETs, 740 and 750. A positive voltage applied at the input terminals, with respect to the input reference polarities, will cause JFETs 740 and 770 to switch on, and JFETs 750 and 760 to switch off. A current path is thus opened from the input terminal 710, through JFET 740, out the positive output terminal, through the resistive load, into the negative output terminal, through JFET 770 and out the input terminal 715.

A negative voltage applied at the input terminal 710, with respect to the input reference polarities, will cause JFETs 750 and 760 to switch on, and JFETs 740 and 770 to switch off. A current path is thus opened from the input terminal 715, through JFET 750, out the positive output terminal, through the resistive load, into the negative output terminal, through JFET 760 and out the input terminal 710. Thus for either input voltage polarity, a direct current is produced at the output in a direction from the positive output terminal toward the negative output terminal. Using just use 4 n-chan JFETs or 4 p-chan JFETs, the fullwave bridge rectifier can also be realized in accordance with an embodiment of the present invention.

Figure 8:
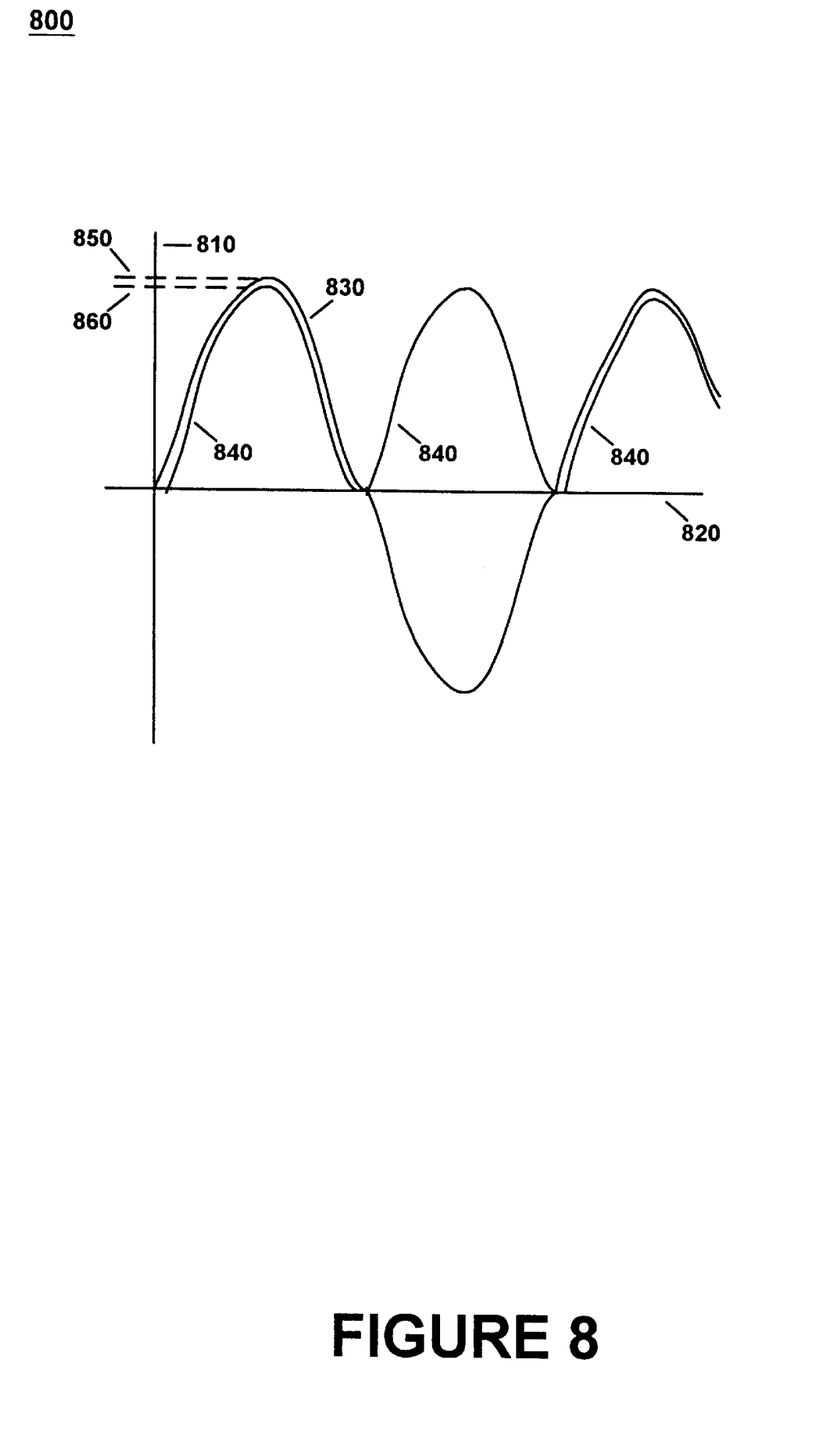
FIG. 8 are exemplary electrical waveforms for a full wave rectifier circuit according to an embodiment of the present invention showing a sinusoidal signal applied at the input and the improved full wave rectified signal present at the output.

FIG. 8 shows electrical waveforms 800 for a full wave rectifier circuit having a sinusoidal signal 830 applied at the input and the resulting full wave rectified signal 840 present at the output in one embodiment of the present invention. The vertical axis 810 is either a voltage or a current scale while the horizontal axis 820 is a time scale. The peak value of the applied input signal 850 is always greater than the peak value of the rectified output waveform 860.

The difference between these two peak values is representative of the power loss in the rectifier elements used in the circuit. The greater the difference, the greater the power loss and the greater the heating of the rectifier elements. In the present invention, the source to drain voltage drop when a JFET is in the on state is a function of JFET threshold voltage which can be considerably less than one tenth of a volt. Furthermore, the on resistance of the JFET is very small. As a result, the power dissipated in the JFETs is thus minimized and the efficiency of this rectifier circuit is greatly increased over existing circuits. Finally, since the peak value of the rectified output voltage is very nearly equal to the peak value of the input sinusoid, this rectifier circuit is useful in low voltage power supply applications.

The preferred embodiment of the present invention, full wave rectifier circuit using normally off JFETs, is thus described. While the present invention has been described in particular embodiments, it should be appreciated that the present invention should not be construed as limited by such embodiments, but rather construed according to the below claims.

What is claimed is:

1. A full wave rectifier circuit comprising:
   a) a first input; a second input; a positive output and a negative output;
   b) a first p-channel, enhancement mode Junction field Effect Transistor (JFET), comprising a gate grid array, a source lead and a drain lead connected between said first input and said positive output and a gate lead coupled to said second input;
   c) a second p-channel, enhancement mode JFET comprising a gate grid array, a source lead and a drain lead connected between said positive output and said second input and a gate lead coupled to said first input;
   d) a first n-channel, enhancement mode JFET comprising a gate grid array, a source lead and a drain lead connected between said first input and said negative output and a gate lead coupled to said second input;
   e) a second n-channel, enhancement mode JFET comprising a gate grid array, a source lead and a drain lead connected between said negative output and said second input and a gate lead coupled to said first input;
   f) wherein a gate lead of each said JFET is coupled such that a potential difference applied between said first input and said second input results in an electric current in a direction from said positive output to said negative output.

2. A full wave rectifier circuit according to claim 1 wherein the potential difference produced between said positive output and said negative output is a full wave rectified version of a potential difference applied between said first input and said second input.

3. A full wave rectifier circuit according to claim 1 wherein the electric current leaving said positive output and entering said negative output is a full wave rectified version of the electric current entering said first input and leaving said second input.

4. A full wave rectifier circuit according to claim 1 wherein a potential difference applied between said first input and said second input with said first input at a positive potential with respect to said second input results in a potential difference between said positive output and said negative output with said positive output at a positive potential with respect to said negative output.

5. A full wave rectifier circuit according to claim 1 wherein a potential difference applied between said first input and said second input with said first input at a negative potential with respect to said second input results in a potential difference between said positive output and said negative output with said positive output at a positive potential with respect to said negative output.

6. A full wave rectifier circuit according to claim 1 wherein said gate lead of said first n-channel JFET is connected to said gate lead of said first p-channel JFET; wherein a first current limiting device is connected between said gate leads and said second input.

7. A full wave rectifier circuit according to claim 1 wherein said gate lead of said second n-channel JFET is connected to said gate lead of said second p-channel JFET; wherein a second current limiting device is connected between said gate leads and said first input.

8. A full wave rectifier circuit according to claim 1 wherein a two terminal starter device is connected between a source and a drain of each said JFET.

9. A full wave rectifier circuit according to claim 1 wherein said JFETs are symmetrical source to drain and said drain lead and said source lead of each said JFET are interchangeable.

10. A full wave rectifier circuit according to claim 1 further comprising a current limiting device connected between a gate to an input for device protection.

11. A full wave rectifier circuit according to claim 1 wherein said rectifier circuit is manufactured as an integrated circuit using a substance from the class containing germanium and silicon and silicon compounds and combinations of periodic table column III and column V elements.

12. A full wave rectifier circuit comprising:
   (a) a first input; a second input; a positive output and a negative output;
   (b) a first n-channel, enhancement mode JFET comprising a gate grid array, a source and a gate connected to said first input and a drain connected to said positive output;
   (c) a second n-channel, enhancement mode JFET comprising a gate grid array, a source and a gate connected to said second input and a drain connected to said positive output;
   (d) a first p-channel, enhancement mode JFET comprising a gate grid array, a source and a gate connected to said first input and a drain connected to said negative output, and
   (e) a second p-channel, enhancement mode JFET comprising a gate grid array, a source and a gate connected to said second input and a drain connected to said negative output.

13. A full wave rectifier circuit according to claim 12 wherein an electric current entering said first input passes through said first n-channel JFET, exits said positive output, enters said negative output, passes through said second p-channel JFET and exits said second input.

14. A full wave rectifier circuit according to claim 12 wherein an electric current entering said second input passes through said second n-channel JFET, exits said positive output, enters said negative output, passes through said first p-channel JFET and exits said first input.

15. A full wave rectifier circuit according to claim 12 wherein said rectifier circuit is manufactured as an integrated circuit using a substance from the class containing germanium and silicon and silicon compounds and combinations of periodic table column III and column V elements.

16. A full wave rectifier circuit according to claim 12 wherein said JFETs are asymmetrical source to drain.

17. A full wave rectifier circuit according to claim 12 wherein the potential difference produced between said positive output and said negative output is a full wave rectified version of a potential difference applied between said first input and said second input.

18. A full wave rectifier circuit comprising:
   a) two n-channel enhancement mode Junction Field Effect Transistors (JFET), each comprising a gate grid array, and two p-channel enhancement mode JFETs, each comprising a gate grid array;

b) said JFETs in a four node series circuit formed by connecting the drain lead of a first n-channel JFET to the drain lead of a second n-channel JFET and the source lead of said second n-channel JFET to the source lead of a first p-channel JFET and the drain lead of said first p-channel JFET to the drain lead of a second p-channel JFET and the source lead of said second p-channel JFET to the source lead of said first n-channel JFET;

c) wherein the gate leads of said JFETs are coupled such that an applied electrical potential between a first node connecting one said n-channel JFET and one said p-channel JFET and a second node connecting one said n-channel JFET and one said p-channel JFET results in a full wave rectified version of said applied electrical potential between a third node connecting said n-channel JFETs and a fourth node connecting said p-channel JFETs.

19. A full wave rectifier circuit according to claim 18 wherein said JFETs are asymmetrical source to drain and said gate and said source of each said JFET are electrically connected.

20. A full wave rectifier circuit according to claim 18 wherein said JFETs are symmetrical source to drain and a starter device is connected between said source and said drain of each said JFET.

21. A full wave rectifier circuit according to claim 18 wherein said first node is coupled to said gate leads of said n-channel JFET and said p-channel JFET connected to said second node and said second node is coupled to said gate leads of said n-channel JFET and said p-channel JFET connected to said first node.

22. A full wave rectifier circuit according to claim 18 wherein said rectifier circuit is manufactured as an integrated circuit using a substance from the class containing germanium and silicon and silicon compounds and combinations of periodic table column III and column V elements.

* * * * *